Figure 1:
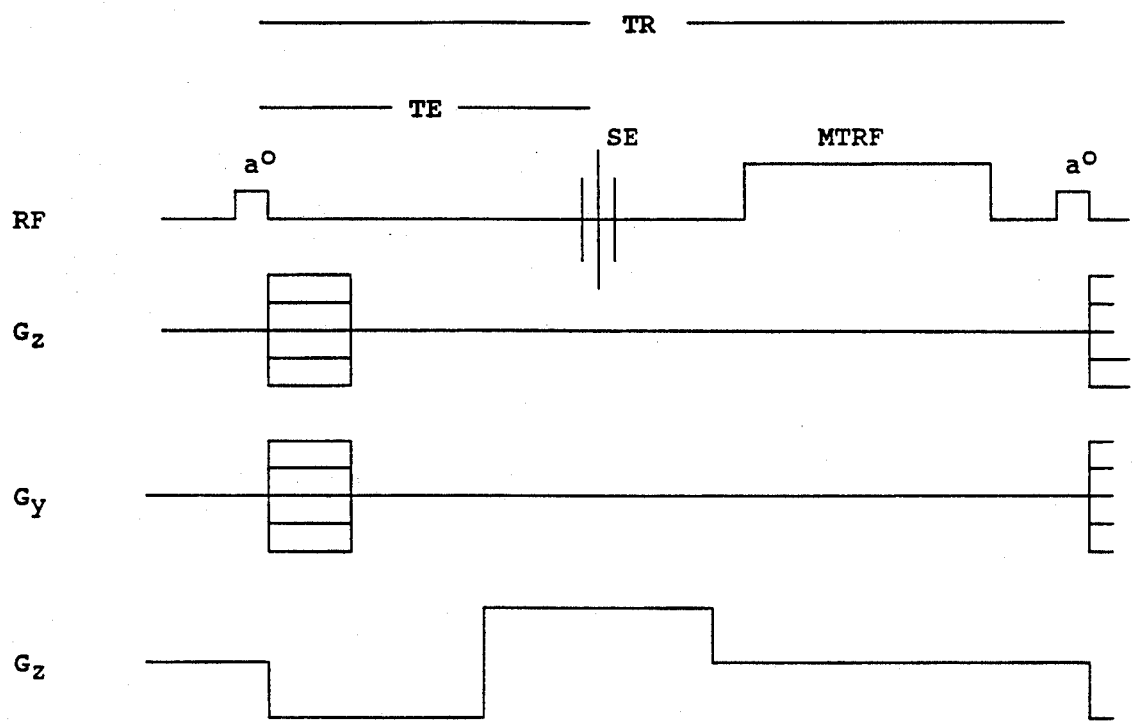

United States Patent [19]

Sepponen

[11] Patent Number: 5,159,270

[45] Date of Patent: Oct. 27, 1992

[54] IMAGING METHOD

[75] Inventor: Raimo Sepponen, Helsinki, Finland

[73] Assignee: Instrumentarium Corp., Finland

[21] Appl. No.: 574,445

[22] Filed: Aug. 28, 1990

[30] Foreign Application Priority Data

Nov. 27, 1989 [FI] Finland .................................. 895651

[51] Int. Cl.[5] ............................................ G01R 33/20
[52] U.S. Cl. ..................................................... 324/309
[58] Field of Search ............... 324/300, 307, 309, 311, 324/312, 313

[56] References Cited

U.S. PATENT DOCUMENTS

| | | | |
|---|---|---|---|
| 4,587,489 | 5/1986 | Wehrli | 324/309 |
| 4,699,148 | 10/1987 | Gyngnell | 128/653 |
| 4,707,658 | 11/1987 | Framm et al. | 324/309 |

FOREIGN PATENT DOCUMENTS

| | | |
|---|---|---|
| 205223 | 10/1986 | European Pat. Off. |
| 224005 | 6/1987 | European Pat. Off. |
| 3637998 | 5/1988 | Fed. Rep. of Germany |

OTHER PUBLICATIONS

Crooks, L. E., "Selective Irradiation Line Scan Techniques for NMR Imaging", IEEE Trans. Nucl. Sci., vol. 27, pp. 1239-1241, 1980.

Tanttu, J., "Koelaiteisto NMR-Kuvausta Varten", University of Helsinki, 1982.

Pohjonen, J., "Koelaitteisto Liikkuvan Kohteen NMR-Kuvausta Varten", Helsinki Technical University, 1984.

Buxton, R. B., "Signal Intensity in Fast NMR Imaging with Short Repetition Times", J. Mag. Reson., vol. 83, pp. 576-585, 1989.

Primary Examiner—Michael J. Tokar
Attorney, Agent, or Firm—Andrus, Sceales, Starke & Sawall

[57] ABSTRACT

The invention relates to an imaging method for the examination of an object such as a human body, an animal or a tree trunk, based on the NMR phenomenon and magnetic resonance imaging techniques. The amplitude of excitation pulses used for producing an NMR signal is selected in a manner that a so-called excitation angle is smaller than 90° and the object of these excitation pulses is subjected to electromagnetic irradiation at a frequency which is different from the resonance frequency of an NMR signal recording on the magnetic image of said object.

15 Claims, 2 Drawing Sheets

IMAGING METHOD

The present invention relates to an imaging method based on nuclear magnetic resonance for the examination of e.g. a human body, animals, foodstuffs or a tree trunk.

Magnetic resonance imaging (MRI) is a method which utilizes a nuclear magnetic resonance phenomenon (NMR) for finding out the local distributions of the nuclear density and nucleus-related NMR properties of an object or the physical and chemical characteristics having an effect thereon. Such NMR properties include e.g.: longitudinal relaxation (characterized by longitudinal relaxation time T1), transverse relaxation (characterized by transverse relaxation time T2), relaxation in a rotating frame of reference (characterized by relaxation time T1rho), chemical shift, coupling factors between the nuclei. NMR properties are effected by physical phenomena, e.g.: flow rate, diffusion, paramagnetic materials, ferromagnetic materials, viscosity and temperature.

Methods and applications of magnetic resonance and magnetic resonance imaging have been described in a number of references: Wehrli FW, Shaw D, Kneeland BJ: Biomedical Magnetic Resonance Imaging, VCH Publishers, Inc., New York 1988, Stark DD and Bradley WG: Magnetic resonance imaging, C. V. Mosby Comp., St. Louis 1988, Gadian DG: Nuclear magnetic resonance and its applications to living systems, Oxford Univ. Press, London 1982, Shaw D: Fourier transform NMR spectroscopy, Elsevier, Amsterdam, 1984, Battocletti JH: NMR proton imaging, CRC Crist. Rev. Biomed. Eng. vol. 11, pp. 313-356, 1984, Mansfield P and Morris PG: NMR imaging in biomedicine, Adv. in magnetic resonance, Academic Press, New York 1982, Abragam A: The principles of nuclear magnetism, Clarendon Press, Oxford 1961, Farrar TC, Becker ED: Pulse and Fourier Transform NMR, Academic Press, New York 1971, Lasker SE and Milvy P (eds.): Electron spin resonance and nuclear magnetic resonance in biology and medicine and magnetic resonance in biological systems, Annals of New York Academy of Sciences vol. 222, New York Academy of Sciences, 1973, Sepponen RE: Discrimination and characterization of biological tissues with magnetic resonance imaging: A study on methods for T1, T2, T1rho and Chemical shift imaging, Acta polytechnica scandinavica EL-56, Helsinki 1986, Fukushima E and Roeder SB: Experimental pulse NMR, Addison Wesley, London 1981, Thomas SR and Dixon RL (eds.) NMR in medicine: The instrumantation and clinical applications, Medical Physics Monograph No. 14, American Institute of Physics, New York 1986, Anqerson WA et al: U.S. Pat. No. 3 475 680, Ernst RR: U.S. Pat. No. 3 501 691, Tomlinson BL et al: U.S. Pat. No. 4 034 191, Ernst RR: U.S. Pat. No. 3 873 909, Ernst RR: U.S. Pat. No. 4 070 611, Bertrand RD et al: U.S. Pat. No. 4 345 207, Young IR: U.S. Pat. No. 4 563 647Hofer DC et al: U.S. Pat. No. 4 110 681, Savolainen MK: Magnetic resonance imaging at 0.02 T: Design and evaluation of radio frequency coils with wave winding, Acta Polytechnica Scandinavica Ph 158, Helsinki 1988, Sepponen RE: U.S. Pat. No. 4 743 850, Sepponen RE: U.S. Pat. No. 4 654 595, Savolainen MK: U.S. Pat. No. 4 712 068, Sepponen RE: U.S. Pat. No. 4 587 493, Savolainen MK: U.S. Pat. No. 4 644 281 and Kupiainen J: U.S. Pat. No. 4 668 904.

It is prior known to apply to an object to be examined a radiofrequency radiation at a frequency different from nuclear magnetic resonance frequency and, thus, to saturate the nuclear magnetization of such components whose transverse relaxation time T2 is short. In case of a biological tissue, the signal visible in magnetic resonance imaging originates from the protons of mobile water or fat molecules. Typically, T2 of this NMR signal is more than 30 ms. The protons of proteins have an NMR signal whose T2 is less than 0.5 ms. By subjecting a tissue to a radiation different from the resonance frequency of water and fat molecules it is possible to saturate the nuclear magnetization of the protons of proteins without directly affecting the nuclear magnetism of the protons of water and fat. In practice, there is a continuous exchange process in a tissue among these different proton groups. Thus, saturation of the magnetization of protein protons has an effect on the nuclear magnetization of water and fat protons which are in direct interaction therewith. This so-called magnetization transfer, MT, phenomenon brings about an improvement of tissue contrast in magnetic resonance imaging and the examination of the interaction between tissue proteins, water and fat.

A drawback in the prior art technology is that the application of MT is troublesome when using so-called multislice methods and, therefore, the imaging process is very ineffective.

The principle of multiple slice or multislice imaging is described e.g. in the reference Crooks LE: Selective irradiation line scan techniques of NMR imaging, IEEE Trans. Nucl. Sci., vol. 27, pp. 1239-1241, 1980.

The invention set forth in the annexed claims is capable of eliminating the drawbacks of the prior art and facilitating the use of a magnetization transfer method effectively in connection with magnetic resonance imaging.

The invention is illustrated in the accompanying drawings, in which

Figure 2:
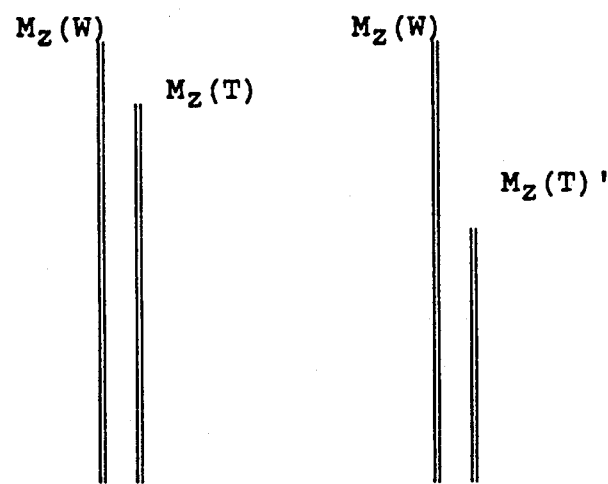

FIG. 1 shows one imaging sequence of the invention for the three-dimensional imaging of an object, FIG. 2 shows the effect of magnetization transfer on tissue contrast.

FIG. 1 illustrates a pulse diagram for an imaging sequence of the invention. The excitation pulses are shown on axis RF and have a repetition rate of TR and an excitation angle a thereof is selected in a manner that longitudinal nuclear magnetization $M_z$ diminishes only slightly ( a $<45°$, generally $<90°$ ). Between the excitation pulses occur the gradient operations which are required by magnetic resonance imaging and illustrated by axes $G_x$, $G_y$ and $G_z$. As a result of excitation and gradient operations, the protons of an object emit a recordable spin echo SE which is generated after a period TE (echo delay) from the excitation pulse. Between the excitations, the protons of an object are irradiated with an electromagnetic pulse MTRF emitted at a frequency differing from the resonance frequency by appr. 1–10 kHz. This irradiation results in the weakening of longitudinal magnetization in tissues having a close interaction between proteins, water and fat molecules. Thus, the contrast of an image is improved. For example, the longitudinal magnetization of cerebrospinal fluid (CSF) does not change while the longitudinal magnetization of cerebral tissue becomes weaker. Thus, the contrast between this pair of tissues is improved.

FIG. 2 illustrates the improvement of contrast as a result of a change in the longitudinal magnetizations of a low-protein and a high-protein tissue. In the figure, $M_z(W)$ is the longitudinal magnetization of a low-protein tissue (e.g. CSF) and $M_z(T)$ is the longitudinal magnetization of a high-protein, tissue which, as a result of MT phenomenon, assumes the value $M_z(T)'$.

Imaging sequences having a small a and SE formed by means of gradient operations are described e.g. in references Frahm J, Haase A, Matthaei D, Haenicke W, Merboldt K-D: U.S. Pat. No. 4 707 658 and Gyngnell ML: 4 699 148, earlier in references Tanttu J: Koelaitteisto NMR-kuvausta varten (Test apparatus for NMR imaging), Graduation Thesis, Helsinki Technical University, Department of Technical Physics, 1982, page 69 and Pohjonen J: Koelaitteisto liikuvan kohteen NMR-kuvausta varten (Test apparatus for the NMR imaging of a moving object), Licentiate Thesis, Helsinki Technical University, Department of Technical Physics, 1984, pp. 39–40.

The contrast in images formed by these imaging sequences is described e.g. in reference Buxton RB, Fisel CR, Chien D, Brady TJ: Signal intensity in fast NMR imaging with short repetition times, J. Magn. Reson., vol. 83, pp. 576–585, 1989. This very description applies also to an imaging method of the invention provided that the change of longitudinal magnetization as a result of MT phenomenon is taken into consideration. By a proper selection of excitation angle a, TR and TE and the duration and amplitude of pulse MTRF it is possible to maximize the image-displayed contrast for a chosen pair of substances (e.g. white and gray substance of the brain).

Just one embodiment of the invention has been described in the above specification.

I claim:

1. A method for the NMR examination of an object, said object being subjected to a longitudinal magnetic field for which there exists a corresponding NMR frequency, said method comprising the steps of:

applying a series of rf NMR excitation pulses to the object, said pulses resulting in an excitation angle of less than 90°, sequential pulses in said series having a repetition time interval therebetween;

subjecting the object to rf electromagnetic radiation in the repetition time interval, said electromagnetic radiation having a frequency different than the NMR frequency; and obtaining NMR signal data from the object.

2. A method according to claim 1 further defined as applying a series of rf excitation pulses resulting in an excitation angle of less than 45°.

3. A method according to claim 1 further defined as subjecting the object to rf electromagnetic radiation having a frequency which differs from the NMR frequency by approximately 1-10 kHz.

4. A method according to claim 1 further defined as applying at least one magnetic field gradient to the object.

5. A method according to claim 4 further defined as applying the at least one magnetic field gradient to the object during the repetition time interval.

6. A method according to claim 1 further defined as obtaining the NMR signal data in the repetition interval.

7. A method according to claim 1 further defined as obtaining the NMR signal data in the repetition interval prior to subjecting the object to rf electromagnetic radiation.

8. A method according to claim 1 further defined as one for forming an NMR image of the object and including the step of providing an NMR image from the NMR signal data obtained from the object.

9. A method according to claim 8 further defined as one for forming an NMR image of an object having a plurality of components in which longitudinal magnetism is altered by differing amounts when the components are subjected to electromagnetic radiation and wherein the properties of the rf electromagnetic radiation to which the object is subjected, the excitation angle and repetition rate of the excitation pulses, and the manner in which the NMR signal data is obtained are selected such as to enhance differences in longitudinal magnetization between components and the contrast between the components in the NMR image.

10. A method according to claim 8 further defined as applying a series of rf excitation pulses having an excitation angle of less than 45°.

11. A method according to claim 8 further defined as subjecting the object to electromagnetic radiation having a frequency which differs from the NMR frequency by 1-10 kHz.

12. A method according to claim 8 further defined as applying at least one gradient magnetic field to the object.

13. A method according to claim 10 further defined as applying the at least one gradient magnetic field to the object during the repetition time interval.

14. A method according to claim 8 further defined as obtaining the NMR signal data in the repetition interval.

15. A method according to claim 8 further defined at obtaining the NMR signal data in the repetition interval prior to subjecting the object to rf electromagnetic radiation.

* * * * *